United States Patent [19]
Ezzell et al.

[11] Patent Number: 5,670,590
[45] Date of Patent: Sep. 23, 1997

[54] ENERGY POLYMERIZABLE COMPOSITIONS, HOMOPOLYMERS AND COPOLYMERS OF OXAZOLINES

[75] Inventors: Stephen A. Ezzell, Woodbury; Diana J. Gerbi, Mendota Heights, both of Minn.

[73] Assignee: Minnesota Mining and Manufacturing Company, St. Paul, Minn.

[21] Appl. No.: 238,912

[22] Filed: May 6, 1994

[51] Int. Cl.$^6$ .............. C08F 4/80; C08F 26/06; C08F 2/46
[52] U.S. Cl. .............. 526/171; 526/170; 526/260; 526/210; 522/169
[58] Field of Search .............. 526/171, 170, 526/210, 260; 522/169

[56] References Cited

U.S. PATENT DOCUMENTS

| | | | |
|---|---|---|---|
| 3,485,797 | 12/1969 | Robins | 260/57 |
| 4,430,491 | 2/1984 | Culbertson et al. | 528/153 |
| 4,613,662 | 9/1986 | Goel | 528/137 |
| 4,652,620 | 3/1987 | Tufts et al. | 525/504 |
| 4,658,011 | 4/1987 | Goel | 528/409 |
| 4,677,137 | 6/1987 | Bany et al. | 522/31 |
| 4,699,920 | 10/1987 | Tiba et al. | 528/141 |
| 4,740,577 | 4/1988 | De Voe et al. | 528/51 |
| 4,746,719 | 5/1988 | Goel et al. | 528/137 |
| 4,748,230 | 5/1988 | Tiba et al. | 528/211 |
| 4,775,737 | 10/1988 | Goel | 528/167 |
| 4,806,267 | 2/1989 | Culbertson et al. | 252/182.23 |
| 4,814,223 | 3/1989 | Tiba et al. | 428/246 |
| 4,839,446 | 6/1989 | Culbertson et al. | 525/504 |
| 4,868,288 | 9/1989 | Meier | 534/15 |
| 4,957,946 | 9/1990 | Meier et al. | 522/59 |
| 5,034,536 | 7/1991 | Fazio | 548/239 |
| 5,059,701 | 10/1991 | Keipert | 556/13 |
| 5,073,476 | 12/1991 | Meier et al. | 430/280 |
| 5,089,536 | 2/1992 | Palazzotto | 522/16 |
| 5,101,463 | 3/1992 | Cubukciyan et al. | 385/72 |
| 5,137,979 | 8/1992 | Maeda et al. | 525/309 |
| 5,164,477 | 11/1992 | Kobayashi et al. | 528/408 |
| 5,191,101 | 3/1993 | Palazzotto et al. | 556/47 |
| 5,215,860 | 6/1993 | McCormick et al. | 430/270 |
| 5,302,687 | 4/1994 | Culbertson et al. | 528/153 |

FOREIGN PATENT DOCUMENTS

| | | | |
|---|---|---|---|
| 0 094 914 | 11/1983 | European Pat. Off. | G03C 1/68 |
| 3-217414 | 9/1991 | Japan | C08G 59/20 |

OTHER PUBLICATIONS

Shiro Kobayashi, Tsutomu Miyutani, Takeo Saegusa, Makromol. Chem. 185, 441–451, 1984.

Functional Monomers Their Preparation, Polymerization, and Application, vol. 2, Ronald H. Yocum (ed.) Marcel Dekker, Inc. NY (1974) pp. 71–91.

"Isomerization Polymerization of 2-Oxazoline. V. Kinetic Studies on the Polymerization of 2-Oxazoline", Saegusa et al., Macromolecules, vol. 6, No. 3, May–Jun. 1973, pp. 315–319.

"Tailored Polymers by Cationic Ring–Opening Polymerizations: Scope and Limitations Based on Mechanistic Aspects", Makromol. Chem., Macromol. Symp. 42/43, 51–68 (1991).

"Cyclische Imidsaureester aus Nitrilen und Aminoalkoholen", Witte et al., Liebigs Ann. Chem. 1974, 996–1009.

"Handbook of Tables for Applied Science", Boltz, R.E. et al., eds. CRC Press: Cleveland Ohio, 1973, p. 130.

"Advanced Inorganic Chemistry" F.A. Cotton, G. Wilkinson, Wiley, 1980, p. 619.

"Handbook of Photochemistry", Steven L. Murov (ed.) Marcel Dekker Inc. N.Y., 27–35, (1973).

"Oxazolines. Their Preparation, Reactions and Applications", Chemical Review, (1971) 71(5) p. 483.

"Polymer synthesis based on 2-(hydroxyphenyl)-2-oxazolines" Kobayashi et al., Makromol. Chem. 185, 441–451 (1984).

*Primary Examiner*—Joseph L. Schofer
*Assistant Examiner*—Wu C. Cheng
*Attorney, Agent, or Firm*—Gary L. Griswold; Walter N. Kirn; Carolyn V. Peters

[57] ABSTRACT

An energy polymerizable composition comprising at least one cationically curable 5 or 6 membered 1,3 oxazyl heterocyclic compounds, including 1,3-oxazoline and 1,3-oxazine monomers or compound and a catalytically effective amount of an initiator comprising an organometallic compound, wherein such oxazoline homopolymers and copolymers exhibit increased rates of reaction, improved thermal stability, and higher glass transition temperatures. The resultant adhesive compositions are particularly useful in electronic applications, such as bonding to polyimide sheets or film, flexible circuits or fiber optic connectors.

12 Claims, No Drawings

ENERGY POLYMERIZABLE COMPOSITIONS, HOMOPOLYMERS AND COPOLYMERS OF OXAZOLINES

TECHNICAL FIELD

This invention relates to energy-polymerizable compositions comprising a cationically curable oxazoline monomer and an organometallic compound.

BACKGROUND OF THE INVENTION

Homopolymers and copolymers of oxazolines and polyphenolic compositions are particularly useful as protective coatings and molding compositions.

Oxazolines are known to undergo ring opening homopolymerization generally in the presence of Lewis acids, inorganic acids and cationic catalysts, such as boron trifluoride etherate. Alkyl trifluoromethane sulfonate or alkyl p-toluene sulfonate will also catalyze oxazoline homopolymerization.

Polymerized bisoxazolines yield materials that tend to be brittle and, therefore bisoxazolines are typically used as co-reactants with diphenolic or polyphenolic materials in order to produce a ductile, chain-extended system. Many of these copolymer or terpolymer polymerizations are catalyzed by alkali or alkaline earth metal cationic complexes, phosphine catalysts and onium salt catalysts.

However, the catalyst or catalyst systems presently known to catalyze oxazoline polymerizations exhibit a variety of disadvantages such as, toxicity, flammability, corrosiveness, moisture sensitivity, irritation and unpleasant odors. Safety hazards can be severe, as some of the catalysts are flammable and precautions must be taken to avoid hazardous systems. For example, onium salt catalysts are known to form protic acids, which can be corrosive. Furthermore, additional precautions must be taken when dealing with moisture sensitive catalysts.

In view of the foregoing discussed disadvantages and limitations that exist with the use of known catalysts, improvements are continuously desired and sought by those within the industry. It was against this background that an alternative catalyst system for producing oxazoline homopolymers and, in particular, copolymers of oxazoline and phenolic resins was sought.

SUMMARY OF THE INVENTION

By the present invention, it has been discovered that an increase in the speed of formation of oxazoline homopolymers and/or copolymers that have improved thermal stability and higher glass transition temperatures can be achieved by using organometallic compounds as catalysts. These polymerizations are either thermally-initiated or photoinitiated.

In addition, it is possible to differentiate catalysts that promote homopolymerization of oxazolines from those that promote copolymerization of oxazolines. In materials comprised of multifunctional oxazolines and a co-reactant, the polymer microstructure obtained upon curing is based on the choice of catalyst and determines the polymer network structure. The polymer microstructure determines the morphology and therefore the properties, such as gel time, glass transition temperature, tensile strength, and processability. With this understanding, it is possible to tailor the materials properties through control of the homopolymerization and copolymerization reactions to achieve a wide range of materials that are suitable for many applications.

Accordingly, in one aspect, this invention provides an energy polymerizable composition comprising:
 a) at least one cationically curable oxazoline monomer or compound; and
 b) a catalytically effective amount of an initiator comprising an organometallic compound.

Bisoxazoline homopolymers are brittle, therefore a co-reactant, such as a phenolic compound, can be added to the above described polymerizable composition to enhance the properties of the resulting bisoxazoline copolymer. However, the possibility of both homopolymerization and copolymerization of the bisoxazoline exists.

The energy polymerizable compositions can be cured or polymerized by heat or by a combination of heat and radiation to produce cured compositions derived from an oxazoline, and optionally, a phenolic co-reactant, and a detectable catalyst residue from the organometallic compound.

In a yet further aspect, this invention provides an article comprising a substrate having on at least one surface thereof a layer of the polymerized product of the polymerizable composition of the invention for a variety of utilities, such as abrasive binders, molding resins, matrix resins, vibration damping layers, and adhesives for electronic applications. Furthermore, the polymerized compositions exhibit excellent adhesion to a wide variety of substrates, including for example, metals (such as aluminum, steel and copper), glass, silicon wafers, polyester, polyimide (for example Kapton™ polyimide films), and flexible circuit materials.

Advantageously, the polymerized compositions of the present invention have an increased curing rate, as well as improvements in other properties, such as higher glass transitions, thermal stability and processability.

In addition to carrying out the polymerization reactions with a thermal catalyst, it is possible to use a photocatalyst, preferably with the application of heat but at a lower temperature than the purely thermal reaction. The uncured oxazoline and co-reactant mixture may be photoinitiated at room temperature and optionally, after processing, subsequent curing will take place at elevated temperatures. In this manner, the photoinitiated materials are latent until a later time when thermal energy is applied. This not only provides an increased shelf life of articles prepared using the compositions of the present invention, but permits the compositions to be thermally cured in situ. Also, use of photocatalysts allows melt processing of oxazoline systems of the invention at temperatures well above typical thermal cure temperatures. Under these conditions, no advancement reaction will occur during heat/melt processing and polymerization will occur only when the catalyst is activated by light plus heat at some later time. Advantageously, the photocatalysts of this invention are visible light sensitive and will photobleach, as well, making them ideal candidates for highly filled or thick compositions.

As used in this application:

"catalytically effective amount" means a quantity sufficient to effect polymerization of the curable composition to a polymerized product at least to the degree to cause an increase in viscosity of the composition under the conditions specified;

"cationically curable oxazoline monomer" means a compound containing at least one oxazoline functional group or oxazoline functional composition;

"copolymer" means a reaction product of an oxazoline monomer with a co-reactant;

"co-reactant" means a material that contains a functionality, that is, reactive with an oxazoline monomer;

"energy induced curing" means curing or polymerization by means of heat or combination of heat and radiation;

"homopolymer" means a composition resulting from the polymerization of a single monomer and specifically refers to an oxazoline homopolymer;

"initiator" and "catalyst" are used interchangeably and mean a substance that effects a chemical reaction and/or changes the speed of a chemical reaction;

"organometallic compound" means a compound that contains at least one carbon atom of an organic group that is bonded to a metal atom of the transition metal series of the Periodic Table of Elements ("Basic Inorganic Chemistry", F. A. Cotton, G. Wilkinson, Wiley, 1980, p 619);

"polymerizable composition" as used herein means a mixture of the initiator system and the cationically curable oxazoline and/or oxazine monomer; optionally, a co-reactant and adjuvants can be present; and "polymerize" or "cure" means to apply sufficient energy to a composition to alter the physical state of the composition, to make it transform from a fluid to less fluid state, to go from a tacky to a non-tacky state, to go from a soluble to insoluble state, or to decrease the amount of cationically polymerizable material by its consumption in a reaction.

DESCRIPTION OF THE PREFERRED EMBODIMENT(S)

By the present invention, it has been discovered that oxazoline homopolymers and/or copolymers with increased rate of reaction, improved thermal stability, and higher glass transition temperatures can be prepared by using organometallic compounds as catalysts. These polymerizations are either thermally-initiated or photoinitiated. While 1,3-oxazoline compounds are a preferred embodiment, the invention also describes homopolymerizations and copolymerizations of 1,3-oxazine compounds. The organometallic compounds promote oxazoline homopolymerization, oxazoline copolymerization with a co-reactant, or a combination of homopolymerization and copolymerization. Furthermore, the organometallic compounds are nonflammable, odorless, less hazardous, moisture insensitive and less toxic than other catalysts known in the art for oxazoline or oxazine polymerizations.

Accordingly, in one aspect, this invention provides an energy polymerizable composition comprising:

a) at least one cationically curable heterocyclic monomer or compound selected from the group consisting of 1,3-oxazolines, 1,3-oxazines, and combinations thereof; and b) a catalytically effective amount of an initiator comprising an organometallic compound.

In a preferred aspect, this invention provides an energy polymerizable composition comprising:

a) at least one cationically curable oxazoline monomer or compound; and b) a catalytically effective amount of an initiator comprising an organometallic compound.

Representative heterocyclic monomers or compounds useful in this invention, hereinafter referred to as "1,3-oxazyl heterocyclic compounds" or "1,3-oxazyl heterocyclics," are those that contain one or more groups per molecule selected from the group consisting of 2-oxazolines, 2 oxazines and combinations thereof. Preferably, these 1,3-oxazyl heterocyclic compounds are devoid of other functional groups capable of interfering with oxazoline homo- or copolymerizations. Preferred 1,3-oxazyl heterocyclic compounds are 1,3-oxazolines, and a particularly preferred 1,3-oxazoline is 2-phenyl-2-oxazoline.

Bisoxazolines are typically derived from polycarboxylic acids and such polycarboxylic acids include, but are not limited to aromatic acids; for example, isophthalic acid, terephthalic acid, 5-t-butylisophthalic acid, trimesic acid, 1,2,4,5-benezenetetracarboxylic acid and 2,6-naphthalene dicarboxylic acid. The preferred polycarboxylic acids include isophthalic acid, terephthalic acid and trimesic acid.

Polyfunctional 1,3-oxazyl heterocyclic compounds useful in this invention can be conveniently prepared by the reaction of the corresponding esters of a polycarboxylic acids and alkanolamines. Nonlimiting examples of poly(1,3-oxazyl heterocyclic) compounds including bisoxazolines are those having a nucleus represented by the following Formulae I and II:

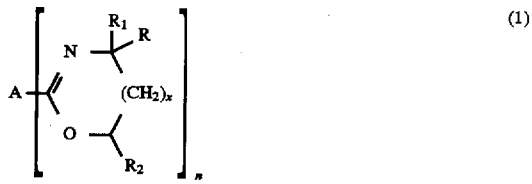

(1)

wherein

A is selected from the group consisting of a cyclic or acyclic aliphatic or substituted cyclic or acyclic aliphatic moiety having from 1 to 20 carbon atoms or an aromatic (aryl) mono- or multinuclear or aliphatic substituted aryl residue having from 6 to 20 carbon atoms and a polymeric or oligomeric residue comprising from about 2 to 200,000 repeating units;

R independently represents H, $CH_3$, $CH_2$–$CH_3$, or $C_6H_5$;

$R_1$ and $R_2$ independently represent H or $CH_3$, provided R and $R_2$ are not both $CH_3$;

x represents an integer of 0 or 1;

n represents an integer of 1, 2, 3 or 4, or

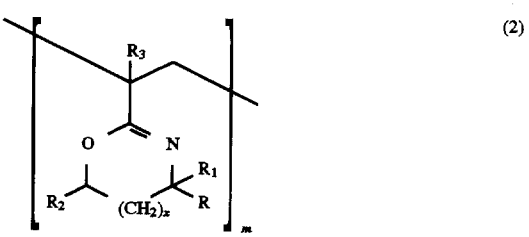

(2)

wherein

R, $R_1$ and $R_2$ and x have the meanings as set forth in Formula I;

$R_3$ represents H or $CH_3$; and m is an integer in the range of 2 to 500,000.

Formulae I and II include monomers, oligomers and comprising 2-(1,3-oxazolines) and 2-(1,3-oxazines), any of which may be substituted as defined above.

Preferably, the Formula I includes but is not limited to 4,4'-5,5'-tetrahydro-2,2'-bisoxazole, (that is, 2,2'-bis(2-oxazoline)); 2,2'-(alkanediyl)bis[4,5-dihydrooxazole], for example, 2,2'-(1,4-butanediyl)bis[4,5-dihydrooxazole] and 2,2'-(1,2-ethanediyl)bis[4,5-dihydrooxazole]; 2,2'-(arylene) bis[4,5-dihydrooxazole], e.g., 2,2'-(1,4-phenylene)bis[4,5-dihydrooxazole]; 2,2'-(1,5-naphthalenyl)bis[4,5dihydrooxazole] and 2,2'-(1,8-anthracenyl)bis[4,5- dihydrooxazole]; sulfonyl, oxy, thio or alkylene bis 2-(arylene)[4,5-dihydrooxazole], for example, sulfonyl bis 2-(1,4-phenylene)bis[4,5-dihydrooxazole], oxybis 2-(1,4-phenylene)bis[4,5-dihydrooxazole], thiobis 2-(1,4-phenylene)bis[4,5-dihydrooxazole] and methylene bis 2-(1,4-phenylene)bis[4,5-dihydrooxazole]; 2,2',2"-(arylene tris [4,5-dihydrooxazole], e.g., 2,2',2"-(1,3,5-phenylene tris [4,5-dihydrooxazole]; 2,2',2",2'"-(arylene tetra[4,5-dihydrooxazole], for example, 2,2',2",2'"-(1,2,4,5-phenylene tetra[4,5-dihydrooxazole] and oligomeric and polymeric materials having terminal oxazoline groups Preferably, Formula II includes but is not limited to oligomeric and polymeric materials having pendant oxazoline groups, such as poly[2-(alkenyl)4,5-dihydrooxazole], for example, poly[2-(propenyl)4,5-dihydrooxazole].

While the preferred examples of Formulae I and II have been described as comprising oxazoline compounds (that is, 5-membered heterocyclic rings), it is to be understood throughout the description of the present invention that the corresponding 6-membered heterocyclic ring compounds (that is, oxazines) can be substituted therefor.

Additional 1,3-oxazyl heterocyclic compounds useful in the present invention are described in U.S. Pat. No. 4,806,267, col. 2, line 46 to col. 5, line 66 and such description is incorporated herein by reference.

Co-reactants for oxazolines contain two or more functional groups capable of reacting with the oxazoline functionality and include, but are not limited to, the following classes of materials: amines, carboxylic acids, epoxies and most preferably, phenolic compounds.

Phenolic compounds useful in this invention include those compounds that contain two or more phenolic hydroxy groups per molecule. Nonlimiting examples of such phenolic compounds include but are not limited to 1,4-benzene diol (hydroquinone), 1,3-benzene diol (resorcinol), 1,5-naphthalene diol and 1,3,5-benzene triol; biphenyl diols, for example, [1,1-biphenyl]-2,2'-diol; alkylene and cycloalkelene bisphenols, for example, 2,2'-methylene bisphenol; 4,4'-(1-methylethylidene)bisphenol (Bisphenol A), 4,4'-(phenylmethylene) bisphenol, 4,4'-(cyclohexanediyl) bisphenol, 4,4'-(1,2-diethyl-1,2-ethenediyl)bisphenol, and 3,4-bis (4-hydroxyphenyl)-2,4-hexadiene; the arylene bisphenols, for example, 4,4'-phenylene bisphenol; oxy, thio and sulfonylbisphenols, for example, 2,3'-oxybisphenol, 4,4'-thiobisphenol and 2,2'-sulfonylbisphenol; bis (hydroxyaryl)alkanones, for example, bis(4-hydroxyphenyl) methanone, 1,5-dihydroxy-9,10-anthracenedione and 4-[bis (4-hydroxyphenyl)methylene-2,5-cyclohexadienedione; various benzamide and benzoate derivatives, for example, 2-hydroxy-N-(4-hydroxyphenyl)benzamide, 4-hydroxy-4-hydroxyphenyl benzoate, 2-methyl-2-[[(4-hydroxybenzoyl) oxy]methyl]-1,3-propanediyl-4-hydroxybenzoate, bis(4-hydroxy benzoate)-1,2-ethandiyl; 2-(4-hydroxy benzoate) ethyl ether, and bis (4-hydroxybenzamide)-1,4-benzenediyl.

In addition to the phenolic compounds noted above, a variety of oligomers containing a plurality of phenolic residues constitute a particularly useful class of materials for reaction with oxazolines using catalytic organometallic compounds. Such phenolic compounds include base- or acid-catalyzed phenol-formaldehyde condensation products, such as novolacs, resoles and phenolic resins having at least one benzilic ether linkage prepared by metal ion catalysts such as described in U.S. Pat. No. 3,485,797 and such description is incorporated herein by reference. Other suitable polyphenol oligomers include addition polymers and copolymers of vinyl-substituted phenols, for example, 4-ethenylphenol, p-isopropenyl phenol, 2-allylphenol, 2-methallylphenol, and the like.

Oxazolines and polyphenolic compounds useful in this invention can also contain substituent groups that do not interfere in oxazoline homo- and co-polymerizations and such substituent groups include but are not limited to alkyl, aryl, cyano, nitro, alkoxy, aryloxy, alkyl sulfides, aryl sulfides, and ester groups.

The curing agent useful in the energy polymerizable compositions of the invention comprises at least one organometallic compound having the structure:

$$[L^1L^2L^3M]^{+e}X_f \qquad (3)$$

wherein $L^1$ represents none, or 1 to 12 ligands contributing pi-electrons that can be the same or different selected from substituted and unsubstituted acyclic and cyclic unsaturated compounds and groups and substituted and unsubstituted carbocyclic aromatic and heterocyclic aromatic compounds, each capable of contributing 2 to 24 pi-electrons to the valence shell of M;

$L^2$ represents none, or 1 to 24 ligands that can be the same or different contributing an even number of sigma-electrons selected from mono-, di-, and tri-dentate ligands, each donating 2, 4, or 6 sigma-electrons to the valence shell of M;

$L^3$ represents none, or 1 to 12 ligands that can be the same or different, each contributing no more than one sigma-electron to the valence shell of each M;

M represents 1 to 4 of the same or different metal atoms selected from the elements of Periodic Groups IVB, VB, VIB, VIIB, and VIII (commonly referred to as transition metals);

e is an integer having a value of 0, 1 or 2, such that the organometallic portion of the molecule is neutral, cationic or dicationic;

X is an anion selected from organic sulfonate and halogenated metal or metalloid groups;

f is an integer of 0, 1, or 2, the number of anions required to balance the charge e on the organometallic portion;

with the proviso that the organometallic compound contains at least one metal-carbon bond and with the proviso that $L^1$, $L^2$, $L^3$, M, e, X, and f are chosen so as to achieve a stable electronic configuration. The organometallic compounds can be used as mixtures and isomeric mixtures. The neutral organometallic compounds (that is, e=0 in Formula 3) used as a curing agent in the energy polymerizable compositions of the invention have an advantage in that they do not require co-catalysts as many epoxy systems do. The absence of anions in the neutral organometallic compounds may be useful in some applications, such as, in electronic adhesives.

Ligands $L^1$ to $L^3$ are well known in the art of transition metal organometallic compounds. At least one such ligand must be present in the catalyst of the present invention. Any of the $L^1$ or $L^2$ or $L^3$ ligands may be present as a pendant group on a polymer.

Ligand $L^1$ of general Formula 3 is provided by any monomeric or polymeric compound having an accessible unsaturated group, i.e., an ethylenic, —C=C— group; acetylenic, —C≡C— group; or aromatic group which has accessible pi-electrons regardless of the total molecular weight of the compound. By "accessible", it is meant that the compound (or precursor compound from which the accessible compound is prepared) bearing the unsaturated group is soluble or swellable in a reaction medium, such as an alcohol, e.g., methanol; a ketone, e.g., methyl ethyl ketone; an ester, e.g., amyl acetate; a halocarbon, e.g., trichloroethylene; an alkane, e.g., decalin; an aromatic hydrocarbon, e.g., anisole; an ether, e.g., tetrahydrofuran; etc, or that the compound is divisible into very fine particles of high surface area so that the unsaturated group (including aromatic group) is sufficiently close to a metal atom to form a pi-bond between that unsaturated group and the metal atom.

Illustrative of ligand $L^1$ are the linear and cyclic ethylenic and acetylenic compounds having less than 100 carbon atoms (when monomeric), preferably having less than 60 carbon atoms, and from zero to 10 hetero atoms selected from nitrogen, sulfur, non-peroxidic oxygen, phosphorous, arsenic, selenium, boron, antimony, tellurium, silicon, germanium, and tin, the ligands being those such as, for example, ethylene, acetylene, propylene, methylacetylene, alpha-butene, 2-butene, diacetylene, butadiene, 1,2-dimethylacetylene, cyclobutene, pentene, cyclopentene, hexene, cyclohexene, 1,3-cyclohexadiene, cyclopentadiene, 1,4-cyclohexadiene, cycloheptene, 1-octene, 4-octene, 3,4-dimethyl-3-hexene, and 1-decene; $eta^3$-allyl, $eta^3$-pentenyl, norbornadiene, $eta^5$-cyclohexadienyl, cycloheptatriene, cyclooctatetraene, and substituted and unsubstituted carbocyclic and heterocyclic aromatic ligands having up to 25 rings and up to 100 carbon atoms and up to 10 hetero atoms selected from nitrogen, sulfur, non-peroxidic oxygen, phosphorus, arsenic, selenium, boron, antimony, tellurium, silicon, germanium, and tin, such as, for example, $eta^5$-cyclopentadienyl, benzene, mesitylene, hexamethylbenzene, fluorene, naphthalene, anthracene, chrysene, pyrene, $eta^7$-cycloheptatrienyl, triphenylmethane, paracyclophane, 1,4-diphenylbutane, $eta^5$-pyrrole, $eta^5$-thiophene, $eta^5$-furan, pyridine, gamma-picoline, quinaldine, benzopyrane, thiochrome, benzoxazine, indole, acridine, carbazole, triphenylene, silabenzene, arsabenzene, stibabenzene, 2,4,6-triphenylphosphabenzene, $eta^5$-selenophene, dibenzostannepine, $eta^5$-tellurophene, phenothiazine, selenanthrene, phenoxaphosphine, phenarsazine, phenatellurazine, $eta^5$-methylcyclopentadienyl, $eta^5$-pentamethylcyclopentadienyl, and 1-phenylborabenzene. Other suitable aromatic compounds can be found by consulting any of many chemical handbooks.

As mentioned before, the ligand can be a unit of a polymer, for example, the phenyl group in polystyrene, poly(styrene-co-butadiene), poly(styrene-co-methyl methacrylate), poly(alpha-methylstyrene), polyvinylcarbazole, and polymethylphenylsiloxane; the cyclopentadiene group in poly(vinylcyclopentadiene); the pyridine group in poly(vinylpyridine), etc. Polymers having a weight average molecular weight up to 1,000,000 or more can be used. It is preferable that 1 to 50 percent of the unsaturated or aromatic groups present in the polymer be complexed with organometallic groups.

Each ligand $L^1$ can be substituted by groups that do not interfere with the complexing of the ligand with the metal atom or which do not reduce the solubility of the ligand to the extent that complexing with the metal atom does not take place. Examples of substituting groups, all of which preferably have less than 30 carbon atoms and up to 10 hetero atoms selected from nitrogen, sulfur, non-peroxidic oxygen, phosphorus, arsenic, selenium, antimony, tellurium, silicon, germanium, tin, and boron, include hydrocarbyl groups such as methyl, ethyl, butyl, dodecyl, tetracosenyl, phenyl, benzyl, allyl, benzylidene, ethenyl, and ethynyl; hydrocarbyloxy groups such as methoxy, butoxy, and phenoxy; hydrocarbylmercapto groups such as methylmercapto (thiomethoxy), phenylmercapto (thiophenoxy); hydrocarbyloxycarbonyl such as methoxycarbonyl and phenoxycarbonyl; hydrocarbylcarbonyl such as formyl, acetyl, and benzoyl; hydrocarbylcarbonyloxy such as acetoxy, benzoxy, and cyclohexanecarbonyloxy; hydrocarbylcarbonamido, e.g., acetamido, benzamido; azo, boryl; halo, e.g., chloro, iodo, bromo, and fluoro; hydroxy; cyano; nitro; nitroso, oxo; dimethylamino; diphenylphosphino, diphenylarsino; diphenylstibine; trimethylgermyl; tributylstannyl; methylseleno; ethyltelluro; and trimethylsiloxy; condensed rings such as benzo, cyclopenta; naphtho, indeno; and the like.

Each ligand $L^2$ in Formula 3 is provided by monodentate and polydentate compounds preferably containing up to about 30 carbon atoms and up to 10 hetero atoms selected from nitrogen, sulfur, non-peroxidic oxygen, phosphorus, arsenic, selenium, antimony, and tellurium, where upon addition to the metal atom, following loss of zero, one, or two hydrogens, the polydentate compounds preferably forming with the metal, M, a 4-, 5-, or 6-membered saturated or unsaturated ring. Examples of suitable monodentate compounds or groups are carbon monoxide, carbon sulfide, carbon selenide, carbon telluride, alcohols such as ethanol, butanol, and phenol; nitrosonium (i.e., $NO^+$); compounds of Group VA elements such as ammonia, phosphine, trimethylamine, trimethylphosphine, triphenylamine, triphenylphosphine, triphenylarsine, triphenylstibine, tributylphosphite; nitriles such as acetonitrile, benzonitrile; isonitriles such as phenylisonitrile, butylisonitrile; carbene groups such as ethoxymethylcarbene, dithiomethoxycarbene; alkylidenes such as methylidene, ethylidene; suitable polydentate compounds or groups include 1,2-bis (diphenylphosphino)ethane, 1,2-bis(diphenylarsino)ethane, bis(diphenylphosphino)methane, ethylenediamine, propylenediamine, diethylenetriamine, 1,3-diisocyanopropane, and hydridotripyrazolylborate; the hydroxycarboxylic acids such as glycolic acid, lactic acid, salicylic acid; polyhydric phenols such as catechol and 2,2'-dihydroxybiphenyl; hydroxyamines such as ethanolamine, propanolamine, and 2-aminophenol; dithiocarbamates such as diethyldithiocarbamate, dibenzyldithiocarbamate; xanthates such as ethyl xanthate, phenyl xanthate; the dithiolenes such as bis(perfluoromethyl)-1,2-dithiolene; aminocarboxylic acids such as alanine, glycine and o-aminobenzoic acid; dicarboxylic diamines as oxalamide, biuret; diketones such as 2,4-pentanedione; hydroxyketones such as 2-hydroxyacetophenone; alpha-hydroxyoximes such as salicylaldoxime; ketoximes such as benzil oxime; and glyoximes such as dimethylglyoxime.

Other suitable groups are the inorganic groups such as, for example, $CN^-$, $SCN^-$, $F^-$, $OH^-$, $Cl^-$, $Br^-$, $I^-$, and $H^-$ and the organic groups such as, for example, acetoxy, formyloxy, benzoyloxy, etc. As mentioned before, the ligand can be a unit of a polymer, for example the amino group in poly (ethyleneamine); the phosphino group in poly(4-vinylphenyldiphenylphosphine); the carboxylic acid group in poly(acrylic acid); and the isonitrile group in poly(4-vinylphenylisonitrile).

Suitable ligands $L^3$ in Formula 3 include any group having in its structure an atom with an unshared electron. Suitable groups can contain any number of carbon atoms and hereto atoms but preferably contain less than 30 carbon atoms and up to 10 hetero atoms selected from nitrogen, sulfur, oxygen, phosphorus, arsenic, selenium, antimony, tellurium, silicon, germanium, tin, and boron. Examples of such groups are hydrocarbyl groups such as methyl, ethyl, propyl, hexyl, dodecyl, phenyl, tolyl, etc.; unsaturated hydrocarbyl groups such as vinyl, $eta^1$-allyl, $eta^1$-butenyl, $eta^1$-cyclohexenyl; the hydrocarbyl derivatives of a Group IVA element such as trimethylgermanyl, triphenylstannyl, and trimethylsilyl, triphenyllead, etc.; and organic groups such as formyl, acetyl, propionyl, acryloyl, octadecyl, benzoyl, toluenesulfonyl, oxaloyl, malonyl, o-phthalyl.

Also suitable as $L^3$ is any group having in its structure two, three, or four unshared electrons. Examples of such groups are $CH_2$, $CHCH_3$, $SiMe_2$, $SiPh_2$ (wherein Ph is phenyl), $SnPh_2$, $GePh_2$, CH, SiMe, SiPh, SnPh, C, Si, and Sn.

M can be any element from the Periodic Groups IVB, VB, VIB, VIIB, and VIIIB, such as, for example, Ti, Zr, Hf, V, Nb, Ta, Cr, Mo, W, Mn, Tc, Re, Fe, Ru, Os, Co, Rh, Ir, Ni, Pd and Pt.

Each X is provided by organic sulfonates, or halogenated metals or metalloids. Examples of such ions are $CH_3SO_3^-$, $CF_3SO_3^-$, $C_6H_5SO_3^-$, p-toluenesulfonate, p-chlorobenzenesulfonate and related isomers and the like, and those in which X has the formula $DZ_r$, wherein D is a metal from Groups IB to VIIIB or a metal or metalloid from Groups IIIA to VA of the Periodic Chart of Elements, Z is a halogen atom or hydroxyl group, and r is an integer having a value of 1 to 6. Preferably, the metals are copper, zinc, titanium, vanadium, chromium, manganese, iron, cobalt, or nickel and the metalloids preferably are boron, aluminum, antimony, tin, arsenic, and phosphorus. Preferably, the halogen, Z, is chlorine or fluorine.

Illustrative of suitable anions are $BF_4^-$, $PF_6^-$, $AsF_6^-$, $SbF_6^-$, $FeCl_4^-$, $SnCl_5^-$, $SbF_5^-$, $AlF_6^-$, $GaCl_4^-$, $InF_4^-$, $TiF_6^-$, etc. Preferably, the anions are $CF_3SO_3^-$, $BF_4^-$, $PF_6^-$, $SbF_6^-$, $SbF_5OH^-$, $AsF_6^-$, and $SbCl_6^-$.

Many of the organometallic compounds useful in the present invention are available from commercial sources such as Strem Chemical Company (Newburyport, Mass.) or Alfa (Johnson Matthey Catalog Company, Inc., Ward Hill, Mass.). Those that are not commercially available can be prepared by literature methods known to those skilled in the art, see for example Dictionary of Organometallic Compounds, Chapman and Hall, London, 1984, Comprehensive Organometallic Chemistry, Pergman Press, Oxford, 1982, or Comprehensive Coordination Chemistry, Pergman Press, 1984. U.S. Pat. No. 5,191,101 describes the preparation of organometallic compounds useful in the present invention.

Illustrative examples of organometallic compounds according to Formula 3 include metal carbonyls such as $Cr(CO)_6$, $Mo(CO)_6$, $W(CO)_6$, $Fe(CO)_5$, $Fe_2(CO)_9$; metal-metal bonded binuclear compounds such as $[CpFe(CO)_2]_2$, $Mn_2(CO)_{10}$, $[CpMo(CO)_3]_2$, $[CpW(CO)_3]_2$, $Re_2(CO)_{10}$, $Co_2(CO)_8$, $Cp(CO)_3W-Mo(CO)_3Cp$, $Cp(CO)_3Mo-Mn(CO)_5$, $Cp(CO)_3Mo-Re(CO)_5$, $(CO)_5Mn-Fe(CO)_2Cp$, $Cp(CO)_3W-Mn(CO)_5$, $Cp(CO)_3W-Re(CO)_5$, $Cp(CO)_3Mo-Co(CO)_4$, $Cp(CO)_3W-Co(CO)_4$, $Cp(CO)_3Mo-Fe(CO)_2Cp$, $Cp(CO)_3W-Fe(CO)_2Cp$, $[CpMo(CO)_2PPh_3]_2$, $Mn_2(CO)_9PPh_3$, $Mn_2(CO)_8(PPh_3)_2$, $(CO)_5Mn-Re(CO)_5$, $Mn_2(CO)_8(1,10$-phenanthroline), $Re_2(CO)_8(1,10$-phenanthroline), $Re_2(CO)_8(2,2'$-biquinoline), $[CpNi(CO)]_2$, $[Cp*Fe(CO)_2]_2$, $Cp(CO)_2Fe—Fe(CO)(PPh_3)Cp$, $Cp(CO)_3Mo—Mo(CO)_2(PPh_3)Cp$; metal clusters such as $Co_4(CO)_{12}$, $Fe_3(CO)_{12}$, $Ru_3(CO)_{12}$, $Os_3(CO)_{12}$, $Ru_3(CO)_{11}PPh_3$, $Ru_3(CO)_{10}(Ph_2P-CH_2CH_2-PPh_2)$, $Fe_2Ru(CO)_{12}$, $Ir_4(CO)_{12}$; compounds containing a metal-Group IVA bond such as $CpFe(CO)_2SnPh_3$, $CpFe(CO)_2GePh_3$, $[CpFe(CO)_2]_2SnPh_2$, $CpMo(CO)_3SnPh_3$, $(CO)_5MnSnPh_3$, $[(CO)_5Mn]_2SnPh_2$, $CpFe(CO)_2PbPh_3$, $CpFe(CO)_2CH_2Ph$, $CpFe(CO)_2(COPh)$, $CpFe(CO)_2(SiPh_3)$, $(CO)_5MnPbPh_3$, $(CO)_5ReSnPh_3$, $CpPtMe_3$, $(MeCp)PtMe_3$, $(Me_3SiCp)PtMe_3$, $CpW(CO)_3Me$, $[CpFe(CO)_2]_4Si$; salts of organometallic complex cations such as $Cp(CO)_3Fe(1+)PF_6(1-)$, $Cp(CO)_2(CS)Fe(1+)BF_4(1-)$, $Cp(CO)(Ph_3Sb)_2Fe(1+)PF_6(1-)$, $Cp(CO)_3Ru(1+)FeCl_4(1-)$, $Cp(CO)_2(Ph_3Sb)Fe(1+)SbF_6(1-)$, $(MeCp)(CO)_2(NO)Mn(1+)SbF_6(1-)$, $(MeCp)(eta^3$-allyl$)(CO)_2Mn(1+)BF_4(1-)$, $Cp(CO)_4Mo(1+)PF_6(1-)$, $(eta^5$-pentadienyl$)(CO)_3Fe(1+)BF_4(1-)$, $(eta^5$-cyclohexadienyl$)(CO)_3Fe(1+)AsF_6(1-)$, $(eta^5$-cyclohexadienyl$)($ethylidene$)(CO)(Ph_3P)Fe(1+)BF_4(1-)$, $Cp($ethoxymethylcarbene$)(CO)(Ph_3P)Fe(1+)BF_4(1-)$, $Cp($dithiomethoxycarbene$)(CO)_2Fe(1+)PF_6(1-)$, $Cp(CO)_2($methylisonitrile$)Fe(1+)AsF_6(1-)$, $(eta^6$-toluene$)(CO)_3Mn(1+)$ $SbF_6(1-)$, $(eta^6$-mesitylene$)(CO)_3Re(1+)SbF_6(1-)$, $(eta^7$-cycloheptatrienyl$)(CO)_3Cr(1+)PF_6(1-)$, $(eta^7$-cycloheptatrienyl$)(CO)_3W(1+)AsF_6(1-)$, $Cp(eta_2$-1-pentene$)(CO)_2Fe(1+)BF_4(1-)$, $(eta^6$-benzene$)CpFe(1+)PF_6(1-)$, $(eta^6$-mesitylene$)CpFe(1+)BF_4(1-)$, $(eta^6$-naphthalene$)CpFe(1+)SbF_6(1-)$, $(eta^6$-acetophenone$)(MeCp)Fe(1+)AsF_6(1-)$, $Cp_2Co(1+)PF_6(1-)$, $Cp_2Fe(1+)SbF_6(1-)$, bis$(eta^5$-chlorocyclopentadienyl$)Ni(1+)PF_6(1-)$, bis$(eta^6$-benzene$)Cr(1+)SbF_6(1-)$, $(CO)_4(Ph_3P)Co(1+)PF_6(1-)$, $(CO)_3(Ph_3P)_2Ir(1+)PF_6(1-)$, $(eta^3$-allyl$)(CO)_5Cr(1+)BF_4(1-)$, $(CO)_5(NO)Mo(1+)PF_6(1-)$, $(eta^3$-allyl$)(CO)_4Fe(1+)SbF_6(1-)$, $(CO)_6Re(1+)SbF_6(1-)$, bis$(eta^6$-hexamethylbenzene$)Mn(1+)BF_4(1-)$, bis$(eta^6$-mesitylene$)$vanadium$(1+)PF_6(1-)$, $(eta^7$-cycloheptatrienyl$)CpMn(1+)AsF_6(1-)$, $(eta^8$-cyclooctatetraenyl$)CpCr(1+)PF_6(1-)$, $(eta^6$-fluorene$)CpFe(1+)PF_6(1-)$, $(eta^6$-1-phenylborabenzene$)CpCo(1+)$ $PF_6(1-)$, $Cp(eta^5$-N-methylpyrrolyl$)Fe(1+)PF_6(1-)$, $(eta^6$-2,3,4,5-tetrathiomethoxybenzene$)CpFe(1+)AsF_6(1-)$, $[(eta^6$-1,2,3,3a, 13b, 13a)benzo(10,11)chryseno(2,3-d)(1,3)-dioxide](MeCp)Fe(1+)PF_6(1-)$, bis$(eta^5$-acetylcyclopentadienyl$)Fe(1+)BF_4(1-)$, $(eta^3$-1-methylallyl$)(CO)_4Fe(+1)PF_6(1-)$, $(eta^3$-1,3-dimethylallyl$)(CO)_4Fe(+1)SbCl_6(1-)$; salts of organometallic complex dications such as bis$(eta^6$-hexamethylbenzene$)Co(2+)[AsF_6(1-)]_2$, bis$(eta^6$-mesitylene$)$ $Fe(2+)[SbF_6(1-)]_2$, bis$(eta^6$-hexamethylbenzene$)Ni(2+)[SbF_6(1-)]_2$, bis$(eta^6$-hexamethylbenzene$)Fe(2+)[PF_6(1-)]_2$, $[(eta^6$-1,2,3,4,5,6$)(eta^6$-7,8,9,10,11,12)biphenyl$]Cp_2Fe_2$-$(2+)[BF_4(1-)]_2$, $[(eta^6$-1,2,3,4,4a, 9a$)(eta^6$-5,6,7,8,8a,5a)fluorene$]CP_2Fe_2(2+)[PF_6(1-)]_2$, $[(eta^6$-1,2,3,4,4a,12a$)(eta^6$-7,8,9,10,10a,6a)chrysene$]$bis-$(eta^6$-benzene$)Cr_2(2+)[SbF_6(1-)]_2$, $(CO)_2$bis$[($diphenylphosphino$)$ethane$]CP_2Fe_2(2+)[PF_6(1-)]_2$, $[(eta^6$-4,5,5a,28c,28b,3a$)(eta^6$-8a, 8b,20d,22a,22b,24c)1H, 14H-dipyrano(3,4,5-gh:3',4', 5'-g'h')anthra(2",1",9":4,5,6;-6",5", 10":4',5'6')$diisoquino$(2,1$-a:2',1'$-al)dipyrimidine$]Cp_2Fe_2(2+)[SbF_6(1-)]_2$, $[(eta^6$-1,2,3,3a,16c,16b$)(eta^6$-9,10,11,11a,13c, 8b)cycloocta-$(1,2,3,4$-def:5,6,7,8-d'e'f')diphenanthrene$]$bis$(eta^5$-acetyl-cyclopentadienyl$)Fe(2+)[BF_4(1-)]_2$; and other organometallic compounds such as $(MeCp)Mn(CO)_3$, $CpMn(CO)_3$, $CpFe(CO)_2Cl$, $[(p$-cymene$)RuCl_2]_2$, $(eta^6$-benzene$)Cr(CO)_3$, $Re(CO)_5Br$, $Cp_2Fe$, $Cp_2TiCl_2$; wherein Me is methyl Ph is phenyl Cp is $eta^5$-cyclopentadienyl Cp* is $eta^5$-pentamethylcyclopentadienyl MeCp is $eta^5$-methylcyclopentadienyl $Me_3SiCp$ is $eta^5$-trimethylsilylcyclopentadienyl.

In the preferred compositions of the invention, the organometallic compound of the initiator system is a salt and is represented by the following formula:

$$[L^4L^5M]^{+q}X_n \qquad (4)$$

wherein

M is selected from the group containing Cr, Ni, Mo, W, Mn, Tc, Re, Fe, Ru, Os, Co, Rh and Ir;

$L^4$ represents none, one or two of the same or different ligands contributing pi-electrons that can be selected from substituted and unsubstituted aromatic compounds and substituted and unsubstituted heterocyclic aromatic compounds, and capable of contributing six pi-electrons to the valence shell of M;

$L^5$ represents none, one or two of the same or different ligands contributing pi-electrons that can be selected from substituted and unsubstituted cyclopentadienyl and indenyl anions, and capable of contributing six pi-electrons to the valence shell of M;

q is an integer having a value of 1 or 2, the residual charge of the complex cation;

X has the same definition as in Formula 3; and n is an integer having a value of 1 or 2, the number of complex anions required to neutralize the charge q on the salt of the organometallic compound.

Ligands $L^4$ and $L^5$ are well known in the art of transition metal organometallic compounds and are taken from the class of $L^1$ in Formula 3.

These salts of the organometallic compounds are known in the art and can be prepared as described in, for example, EPO Nos. 094,914, 094,915, 126,712, and U.S. Pat. Nos. 5,089,536, 5,059,701, 5,191,101, which are incorporated herein by reference for the disclosure.

The most preferred salts of organometallic compounds useful in the photochemically activated compositions of the invention are derived from Formula 4 where $L^4$ is chosen from the class of substituted and unsubstituted aromatic compounds based on benzene and $L^5$ is chosen from the class of substituted and unsubstituted compounds containing a cyclopentadienyl anion, M is Fe and X is selected from the group consisting of tetrafluoroborate, hexafluorophosphate, hexafluoroarsenate, hexafluoroantimonate, hydroxypentafluoroantimonate or trifluoromethanesulfonate. The most preferred salts of the organometallic compounds useful in the invention for the thermal only cured compositions are derived from Formula 4 where only $L^5$ is present, M is Fe and X is selected from the group consisting of tetrafluoroborate, hexafluorophosphate, hexafluoroarsenate, hexafluoroantimonate, hydroxypentafluoroantimonate, or trifluoromethanesulfonate.

Examples of preferred salts of organometallic compounds include:

bis-(eta$^6$-benzene)iron(2+)hexafluoroantimonate bis-(eta$^6$-cumene)iron(2+)hexafluoroantimonate bis-(eta$^6$-durene)iron(2+)hexafluoroantimonate bis-(eta$^6$-p-xylene)iron(1+)hexafluoroantimonate bis-(eta$^6$-mesitylene)iron(2+)trifluoromethanesulfonate bis-(eta$^6$-mesitylene)iron(2+)hexafluoroantimonate bis-(eta$^6$-hexamethylbenzene)iron (2+) hexafluoroantimonate bis-(eta$^6$-pentamethylbenzene)iron(2+) hexafluoroantimonate bis-(eta$^6$-naphthalene)iron(2+)hexafluoroantimonate bis-(eta$^6$-pyrene)iron(2+)hexafluoroantimonate (eta$^6$-naphthalene)(eta$^5$-cyclopentadienyl)iron(1+) hexafluoroantimonate (eta$^6$-pyrene)(eta$^5$-cyclopentadienyl)iron(1+) hexafluoroantimonate (eta$^6$-chrysene)(eta$^5$-cyclopentadienyl)iron(1+) hexafluoroantimonate (eta$^6$-perylene)(eta$^5$-cyclopentadienyl)iron(1+) hexafluoroantimonate (eta$^6$-naphthalene)(eta$^5$-cyclopentadienyl)iron(1+) trifluoromethanesulfonate (eta$^6$-pyrene)(eta$^5$-cyclopentadienyl)iron(1+) trifluoromethanesulfonate bis-(eta$^5$-pentamethylcyclopentadienyl)iron(1+) hexafluoroantimonate bis-(eta$^5$-methylcyclopentadienyl)iron(1+) hexafluoroantimonate bis-(eta$^5$-tri methylsilylcyclopentadienyl)iron(1+) hexafluoroantimonate bis-(eta$^5$-triphenyltincyclopentadienyl)iron(1+) hexafluoroantimonate bis-(eta$^5$-indienyl)iron(1+)hexafluoroantimonate (eta$^5$-cyclopentadienyl)(eta$^5$-methylcyclopentadienyl) iron (1+) hexafluoroantimonate bis-(eta$^5$-cyclopentadienyl)iron(1+) trifluoromethanesulfonate bis-(eta$^5$-tri methylsilylcyclopentadienyl)iron(1+) trifluoromethanesulfonate bis-(eta$^5$-triphenyltincyclopentadienyl)iron(1+) trifluoromethanesulfonate bis-(eta$^5$-cyclopentadienyl)iron(1+)hexafluoroantimonate bis-(eta$^5$-cyclopentadienyl)iron(1+)hexafluorophosphate.

Suitable stoichiometric ratios of oxazoline compound per equivalent of the phenolic reactant when preparing the compositions are typically in the range of 100:0 to 1:99 parts by weight, preferably in the range of 60:40 to 70:30 parts by weight. The organometallic compound is present in the polymerization reaction mixture in a catalytically effective amount and this amount is typically from about 0.5 to 5% by weight of the phenolic (if present) and oxazoline reactants, and preferably from 1 to 3%.

Solvents, preferably organic, can be used to assist in dissolution of the initiator in the cationically polymerizable monomers, and as a processing aid. It may be advantageous to prepare a concentrated solution of the organometallic compound in a small amount of solvent to simplify the preparation of the polymerizable composition. Useful solvents include lactones, such as γ-butyrolactone, and γ-valerolactones; ketones, such as acetone, methyl ethyl ketone, methyl isobutyl ketone, cyclopentanone, and cyclohexanone; sulfones, such as tetramethylene sulfone, 3-methylsulfolane, 2,4-dimethylsulfolane, butadiene sulfone, methyl sulfone, ethyl sulfone, propyl sulfone, butyl sulfone, methyl vinyl sulfone, 2-(methylsulfonyl) ethanol, and 2,2'-sulfonyldiethanol; sulfoxides, such as dimethyl sulfoxide; cyclic carbonates such as propylene carbonate, ethylene carbonate and vinylene carbonate; carboxylic acid esters such as ethyl acetate, Methyl Cellosolve™ and methyl formate; and other solvents such as methylene chloride, nitromethane, acetonitrile, glycol sulfite and 1,2-dimethoxyethane (glyme). In some applications, it may be advantageous to adsorb the initiator onto an inert support such as silica, alumina, or clays, as described in U.S. Pat. No. 4,677,137, which is incorporated herein by reference.

Within the scope of this invention, it is permissible to use adjuvants such as thermoplastic resins to toughen the oxazoline-phenolic compositions and to promote processing of films. Toughening agents, when present, are used in the range of 0 to 2000% based on the combined weight of the oxazoline and phenolic resins, with 50 to 500% being preferred and about 80 to 120% being most preferred. Representative resins include polyamides, polyvinylbutyral, polyhydroxy ethers, polyetherimides, polyether urethanes, polyethers, and polyurethanes.

Other materials that can be blended with the polymerizable mixture include fillers, tackifiers, foaming agents, antioxidants, plasticizers, photosensitizers, reinforcing agents, dyes, pigments, fibers, flame retardants, viscosity adjusting agents, abrasive granules, stabilizers, flow agents, bodying agents, flatting agents, inert fillers, binders, blowing agents, fungicides, bactericides, surfactants, rubber tougheners, as described above, and other additives known to those skilled in the art. These adjuvants, if present are added in an amount effective for their known and intended use.

In general, a composition's physical properties, that is, hardness, stiffness, modulus, elongation, strength, etc., can be controlled by the choice of polyphenolic compound, the ratio of oxazoline to phenolic resin, the type and concentration of organometallic initiator, and adjuvants such as thermoplastic toughening agents.

Preparation of Polymerized Compositions

A polymerizable composition includes an initiator comprising at least one organometallic compound, that upon application of sufficient energy, generally in the form of heat and/or light, will catalyze the polymerization of the polymerizable compositions of the present invention. The level of catalytic activity generally depends on various factors, such as the choice of ligands and counterions in the organometallic compound.

The energy polymerizable compositions can be cured by heat or by a combination of heat and radiation to produce cured compositions derived from an oxazoline, and optionally, a phenolic co-reactant, and a detectable catalyst residue from the organometallic compound.

Polymeric compositions of this invention can be prepared by thermal curing or a combination of thermal and photochemical curing at a temperature in the range of 140° to 275° C. Suitable sources of heat to cure the compositions of the invention include induction heating coils, ovens, hot plates, heat guns, and IR sources including lasers, microwave sources, etc. The required time and temperature to effect polymerization is dependent upon such factors as the identity and concentration of the organometallic compound, the particular cationically polymerizable oxazoline monomer, the co-reactant, if present, the thickness of the material, type of substrate, temperature of the heat source and duration of time at a given temperature. Further, the particular polymerizable composition used and the desired application of the polymerized product can effect the temperature at which polymerization takes place.

For those polymerizable compositions of the invention that are radiation-sensitive, any source of radiation emitting active radiation in the ultraviolet and visible region of the spectrum (for example, about 200 to 600 nanometers) can be used. Suitable sources of radiation include lasers, mercury vapor discharge lamps, carbon arcs, tungsten lamps, xenon lamps, sunlight, etc. The required amount of exposure to effect polymerization is dependent upon such factors as the identity and concentration of the organometallic compound, the particular curable oxazoline monomer, the co-reactant, if any, the thickness of the exposed material, type of substrate, intensity of the radiation source and amount of heat associated with the radiation.

Optionally, it is within the scope of this invention to include spectral sensitizers in the radiation-sensitive composition. Any photosensitiser may be useful if its triplet energy is at least 45 kcal/mole. Examples of such photosensitizers are given in Table 21 of Steven L. Murov (ed.), *Handbook of Photochemistry*, Marcel Dekker Inc., N.Y., 27–35 (1973), and include pyrene, fluoroanthrene, benzil, chrysene, p-terphenyl, acenaphthene, napthalene, phenanthrene, and biphenyl. When present, the amount of photosensitiser used in the practice of the present invention is generally in the range of 0.01 to 10 parts, and preferably 0.1 to 1.0 parts, by weight of photosensitiser per part of organometallic compound.

Articles and Uses of Polymerized Compositions

Compositions of this invention are useful as abrasion resistant or protective coatings for articles, as molded articles, and as adhesives.

Suitable substrates useful to provide articles of the invention include, metals (for example aluminum, copper, cadmium, zinc, nickel, steel, iron, silver, gold), glass, paper, wood, various thermoplastic or thermoset sheeting (for example, polyethylene terephthalate, plasticized polyvinylchloride, polyimide, polypropylene, polyethylene), cloth, ceramics and cellulosics, such as cellulose acetate.

Coating techniques and coating thickness are dependent upon the intended application. Useful coating techniques include but are not limited to knife-coating, bar coating, spin-coating, dipping, spraying, extrusion, and the like. Coating thicknesses can range from 0.002 to 0.4 mm, preferably 0.002 to 0.2 mm. However, this range will depend upon whether the coated article is an abrasive article, a protective coating, an adhesive, a laser ablative layer and such.

Nonlimiting illustrations of articles, along with adjuvants to the polymerizable composition include: (1) coated abrasive articles (addition of abrasive particles); (2) structural/semistructural adhesives (addition of silica fillers, glass bubbles and/or tougheners); (3) magnetic media (addition of magnetic particles); (4) clear abrasion resistant coating (clarity and toughness are the most desired properties); (5) molded articles (prepared by known methods, such as reaction injection molding, casting, etc. and may contain fillers and additional adjuvants); (6) film adhesives (addition of tougheners); (7) photodefinable adhesive films (containing a suitable photocatalyst and optionally bondable to another surface before the final curing takes place); (8) vibration damping materials (addition of tougheners); (9) protective powder coatings; and (10) adhesives for optical fiber connectors.

Objects and advantages of this invention are further illustrated by the following examples, but the particular materials and amounts thereof recited in these example, as well as the conditions and details, should not be construed to unduly limit this invention. All materials are commercially available or known to those skilled in the art except where stated or otherwise apparent.

EXAMPLES

In the examples, all parts, ratios, and percents are by weight unless specifically indicated otherwise. All materials are commercially available or known in the art, unless otherwise stated or apparent. Unless otherwise indicated, commercially available materials are available from Aldrich Chemical. All examples were prepared in ambient atmosphere (in the presence of usual amounts for oxygen and water vapor) unless indicated otherwise.

Test Methods

Differential Scanning Calorimetry (DSC)

Differential Scanning Calorimetry was used to measure the exothermic heat of reaction (Joule/gram (J/g)) associated with the cure of the cationically polymerizable monomer. DSC samples were typically 10–20 milligrams and were run in sealed pans on a Thermal Analysis Instruments 2100 DSC (available from TA Instruments, Wilmington, Del.) at 10° C./min to 350° C. DSC results were dependent on powder particle size and catalyst solubility. All samples were combined for 60 seconds using a Crescent Wig-L-Bug mixer (available from Crescent Co, Lyon, Ill.). Uniform sample preparation was found to be critical for consistency of results.

Photo Differential Scanning Calorimetry (PDSC)

Photo Differential Scanning Calorimetry was used to measure the exothermic heat of reaction associated with the cure of the cationically polymerizable monomer upon exposure to light. PDSC samples were typically 10–20 milligrams and were run in open pans on a Thermal Analysis Instruments 2100 DSC using a 200 watt mercury lamp at 160° C. for 5 minutes, unless otherwise specified. PDSC results were dependent on powder particle size and catalyst solubility. All samples were combined for 60 seconds using a Crescent Wig-L-Bug mixer.

Gel Time

Gel time is the amount of time for a polymerization formulation to lose fluidity at a specified temperature.

Gel Permeation Chromatography (GPC)

GPC separates molecules according to their effective molecular size in solution. A Hewlett Packard 1090 liquid chromatograph fitted with a refractive index detector, with an oven setting of 40° C., and a tetrahydrofuran flow rate of 1.0 ml/min. was used. The liquid chromatograph used a series of 5 columns consisting of HP PL gel having pore sizes of—50 nm (500 Å), 50 nm (500 Å), 10 nm (100 Å), 10 nm (100 Å), and 5 nm (50 Å), respectively.

Glass Transition Temperature by Dynamic Mechanical Analysis (DMA)

Dynamic mechanical properties are the mechanical properties of materials as they are deformed under periodic forces. Glass transition temperatures were determined for cured oxazoline/phenolic systems with bulk specimens measuring 50×5×1.6 mm. A Seiko II DMA Instrument operating at 1 Hz from about −70° to 350° C. with a heating rate of 2° C./minute was used with the sample mounted on a 20 mm flexure fixture.

Thermal Stability Via Thermogravimetric Analysis (TGA)

In thermal gravimetric analysis the amount and rate of weight change of a material, as a function of increasing temperature in a varied but controlled atmosphere was measured. Generally, the weight loss was indicative of some thermal decomposition of the material. The TA Instrument 951 Thermogravimetric Analyzer was used in conjunction with the 2100 DSC. Sample sizes of 5 to 15 mg were used in an air atmosphere with a heating rate of 10° C./min. from room temperature to 400° C. The temperature at which 10% weight loss occurred was reported.

Inductively Coupled Plasma (ICP)

Inductively coupled plasma can detect and quantify trace to major component metallic and metalloid elements. The sample solution was aspirated into an ICP torch operating at 8,000° to 10,000° C., which caused the atoms of the sample material to emit visible and ultraviolet radiation at wavelengths characteristics of the elements involved. The light intensity at the characteristic wavelength was directly proportional to the concentration of the source element of the sample.

Tensile Tests

Tensile tests were conducted following the method described in ASTM 628-87 Tensile Testing Methods standard. The samples were tested at a strain rate of 25 mm/min., gauge length of 7.5 mm and a jaw gap of 25 mm. An Instron Model 1122 tensile tester was used for these tests. Ultimate tensile strength is reported in megapascals (MPa) and is the strength at break; % elongation is reported using the crosshead movement as a measure of elongation; energy at break is reported in Newton meters (Nm) and is the area under the stress-strain curve; and modulus is reported in MPa and is the modulus at 3% elongation.

| Glossary | |
|---|---|
| $(BuO)_3P$ | tributylphosphite |
| $(PhO)_3P$ | triphenylphosphite |
| Aln 320 | novolac phenolic resin commercially available as Alnovol PN3201 from Hoechst Celanese Co. |
| BOX | 1,3-phenylene) bis (4,5-dihydro)-oxazole was obtained from Ashland Oil, Inc. and can be prepared as described in Liebigs Ann. Chem. 1974, 996 (1974) |
| $[CpFe(CO_2)_2]_2$ | cyclopentadienyl iron dicarbonyl dimer commercially available from Pressure Chemical |
| $CpFe(CO_2)Br$ | cyclopentadienyl iron dicarbonyl bromide prepared as described in I. Chem. Soc. 3030 (1956) |
| $CpFe(CO_2)_2I$ | cyclopentadienyl iron dicarbonyl iodide is commercially available from Pressure Chemical |
| $Cp_2FeOTs$ | dicyclopentadienyl iron p-toluene sulfonate prepared as described in Dictionary of Organometallic compounds, Chapman and Hall, London, 1984 |
| IPO | 2-isopropenyl-2-oxazoline was obtained from Dow Chemical Co and can be prepared as described in U.S. Pat. No. 5,034,536 or by references in Tomalia, "Reactive Heterocyclic Monomers," vol. 2 Functional Monomers, pp. 71–89 (R. Yocum & Nyquist ed. 1974) |
| $LiBF_4$ | lithium tetrafluoroborate |
| MeOTs | methyl p-toluene sulfonate |
| $Ph_2IPF_6$ | diphenyliodium hexafluorophosphate |
| $Ph_3CBF_4$ | triphenylcarbenium tetrafluoroborate |
| $Ph_3CCl$ | triphenylchloride commercially available from Alpha Products |
| $Ph_3P$ | triphenylphosphine |
| poly-IPO | poly-isopropenyl oxazoline |
| PKHC | polyether resin commercially available from Union Carbide. |
| pTSA | p-toluene sulfonic acid monohydrate |
| PVB | poly(vinyl butyral) commercially available as S-LEC BX-L from Sekisui |
| SD 1711 | novolac phenolic resin, specified to have 0–0.1% free phenol and a cone and plate viscosity of 1700–2600 cps at 150° C. and commercially available as Durite SD-1711 from Borden, Inc. |
| SD 1731 | novolac phenolic resin, specified to have 0–0.1% free phenol and a cone and plate viscosity of 200–500 cps at 150° C. and commercially available as Durite SD-1731 from Borden, Inc. |
| SD 333A | novolac phenolic resin, specified to have 0–0.1% free phenol and a cone and plate viscosity of 300–600 cps at 125° C. and commercially available as Durite SD-333A from Borden, Inc. |
| SD 7280 | novolac phenolic resin, specified to have 1.5–3.5% free phenol and a Brookfield viscosity of 70–120 cps at 1/50/25° C. for a 50% by wt solution in methy ethyl ketone and commercially available as Durite SD-7280 from Borden, Inc. |
| $Cp_2TiCl_2$ | titanocene dichloride is commercially available from Pressure Chemical |
| UR 2636 | thermoplastic polyamide adhesive resin commercially available as Unirez 2636 from Union Camp Co. |
| VAZO 64 | azobisisobutryonitrile commercially available from Dupont Chemicals |

General Preparation Procedure 1

The general procedure for preparing oxazoline/polyphenolic polymerizable compositions was as follows: A predetermined amount of solid oxazoline was combined with a predetermined amount of catalyst and, optionally, polyphenolic resin. The resulting mixture was mixed in a Crescent Wig-L-Bug™ commercial mixer for 60 seconds, then placed in the appropriate testing device (DSC, TGA, etc.) and treated as described above. If the oxazoline was a liquid, the catalyst was mixed into the liquid in a container, and the mixture was tested as described. For compositions containing thermoplastic tougheners, the oxazoline and optional polyphenolic compound(s) and toughener were dissolved in a suitable solvent, such as methyl ethyl ketone, tetrahydrofuran, or toluene/isopropyl alcohol before coating. After coating, the sample was dried to remove the solvent, and a portion of the resulting film was tested as described. Compositions containing a photoinitiator were kept from light. The materials were cured at conditions specific to the contemplated application and representative conditions are detailed in the following illustrative examples.

Example 1a

Preparation of Polyisopropenyl Oxazoline (Poly-IPO)

30 g of 2-isopropenyl-2-oxazoline, 30 g of acetone and 15 g of isopropyl alcohol were combined. To this mixture was added 300 mg VAZO™ 64, after which the stirred mixture was refluxed for eight hours. The mixture was cooled, and an additional 300 mg VAZO™ 64 were added and the mixture was stirred and refluxed over night. Poly-IPO was precipitated by pouring into hexane, collected and dried at 45° C. under vacuum. The yield was 22.9 g.

Examples 1–18

Thermally Initiated Polymerizations

Examples 1–3 and 18

Mixtures of 0.02 g of an organometallic compound and 1.00 g BOX powder were prepared as described in General Preparation Procedure 1, using the organometallic compound initiators summarized in Table 1. Results of evaluations are summarized in Table 2.

Examples 4–10 and 17

Mixtures of 0.02 g of an organometallic compound, 0.67 g BOX powder and 0.33 g SD 7280 phenolic Novolac resin were prepared as described in General Preparation Procedure 1, using the organometallic compound initiators as summarized in Table 1. Results of evaluations are summarized in Table 2. Example 10 showed 0.178% by weight iron, as detected by ICP.

Examples 11–16

Examples 11–16

Mixtures of 0.02 g of an organometallic compound, 0.67 g BOX powder and 0.33 g phenolic resin (see below) were prepared as described in General Preparation Procedure 1, using the organometallic compound initiators summarized in Table 1. Examples 11 and 14 used SD 333A phenolic resin, examples 12 and 15 used SD 1731 phenolic resin, and examples 13 and 16 used SD 1711 phenolic resin. Results of evaluations are summarized in Table 2.

TABLE 1

| Examples | Initiator |
|---|---|
| 1, 17 | CpFeXylPF$_6$ |
| 2, 4, 11–13, 18 | Cp$_2$FePF$_6$ |
| 3 | Cp$_2$FeOTs |
| 5, 14–16 | Cp$_2$FeSbF$_6$ |
| 6 | Dur$_2$Fe(SbF$_6$)$_2$ |
| 7 | Cp$_2$FeCF$_3$SO$_3$ |

TABLE 1-continued

| Examples | Initiator |
|---|---|
| 8 | Mes$_2$Fe(SbF$_6$)$_2$ |
| 9 | Xyl$_2$Fe(SbF$_6$)$_2$ |
| 10 | (Me$_5$Cp)$_2$Fe(PF$_6$)$_2$ |

TABLE 2

| Example | DSC T$_{max}$ (Total Energy) | Gel Time (minutes) 170° C. | 180° C. | 190° C. | DMA[a] | TGA[c] |
|---|---|---|---|---|---|---|
| 1 | 208° C. (345 J/g) | 14.5 | 4.5 | 2.0 | — | — |
| 2 | 159° C. (222 J/g) | 0.58 | 0.42 | 0.17 | — | — |
| 3 | 204, 304° C. (78, 48 J/g) | — | — | — | — | — |
| 4 | 170° C. (231 J/g) | 1.0 | 1.0 | 0.33 | 279° C. | 375° C. |
| 5 | 165° C. (215 J/g) | 3.0 | 1.0 | 0.5 | 132° C. | 362° C. |
| 6 | 162° C. (139 J/g) | 0.75 | 0.67 | 0.50 | — | — |
| 7 | 176° C. (99 J/g) | 35 | 26 | 10.5 | — | — |
| 8 | 173° C. (65 J/g) | 1.25 | 0.75 | 0.5 | — | 370° C. |
| 9 | 159° C. (50 J/g) | — | — | — | — | — |
| 10 | 171° C. (34 J/g) | 6.0 | — | — | — | — |
| 11 | 161° C. (350 J/g) | 16 | 3 | — | 226° C. | 373° C. |
| 12 | 150° C. (251 J/g) | 1.0 | 0.83 | 0.33 | 273° C. | 373° C. |
| 13 | 154° C. (273 J/g) | 0.75 | 0.5 | 0.33 | 285° C. | 375° C. |
| 14 | 163° C. (139 J/g) | — | — | — | — | — |
| 15 | 156° C. (251 J/g) | — | — | — | — | — |
| 16 | 152° C. (274 J/g) | — | — | — | — | — |
| 17 | 240° C. (84 J/g) | 38 | 20.5 | 8.0 | 116° C. | 376° C. |
| 18 | 163° C. (34 J/g) | 0.5 | 0.42 | 0.33 | — | 310° C. |

[a]DMA samples were cured 2 hours at 170° C. and 1 hour at 190° C.
[c]TGA:10% weight loss temperature, as a measure of stability

Comparative Examples C1–C6

A series of examples was prepared with and without a catalyst known to polymerize oxazolines and with and without added phenolic resin. The components and amounts are summarized in Table 3. Examples C1 and C2 were prepared without a catalyst, to determine if the BOX or BOX plus phenolic compounds would polymerize on heating in the absence of a catalyst. Examples C3–C6 were prepared to evaluate several properties using triphenylmethane tetrafluoroborate (Ph$_3$CBF$_4$), a catalyst known for oxazoline polymerizations. Various properties were evaluated, as summarized in Table 4. By comparing results presented in Table 4 to those in Table 2, it can be seen that the inventive materials of Examples 1–18 generally illustrate a lower temperature cure than those of Examples C3–C6, achieving higher glass transition temperatures, faster gel times and increased thermal stability. It will be appreciated that a range of these values may be obtained with the organometallic compounds. Examples C6A and C6B were polymerized using different cure schedules.

TABLE 3

| Components | Examples | | | | | |
|---|---|---|---|---|---|---|
| (wt in grams) | C1 | C2 | C3 | C4 | C5 | C6 |
| BOX | 1.0 | 0.67 | 0.67 | 0.67 | 0.67 | 0.50 |
| SD 7280 | — | 0.33 | 0.33 | — | 0.33 | 0.45 |
| $Ph_3CBF_4$ | — | — | 0.01 | 0.01 | 0.02 | 0.01 |
| Aln 320 | — | — | — | 0.33 | — | — |

TABLE 4

| Example | DSC $T_{max}$ (Total Energy) | Gel Time (minutes) | | | DMA(a) | TGA(c) |
|---|---|---|---|---|---|---|
| | | 170° C. | 180° C. | 190° C. | | |
| C1 | — | — | — | — | — | — |
| C2 | — | — | — | 35 | 106° C. | 364° C. |
| C3 | 168° C. (10 J/g) | 38 | 30 | 14 | 108° C. | 364° C. |
| C4 | 170° C. (116 J/g) | >60 | 37 | 17 | 162° C. | 365° C. |
| C5 | 173° C. (103 J/g) | 1 | 0.75 | 0.5 | 187° C. | 364° C. |
| C6A | 170° C. (29 J/g) | 41 | 27.5 | 13 | 164° C.(b) | 365° C. |
| C6B | 170° C. (29 J/g) | 41 | 27.5 | 13 | 109° C. | 366° C. |

(a)DMA samples were cured 2 hours at 170° C. and 1 hour at 190° C.
(b)DMA sample was cured 2 hours at 175° C. and 1 hour at 225° C.
(c)TGA:10% weight loss temperature, as a measure of stability

Examples 19–24

Photoinitiated Polymerizations

Even though photoinitiated systems were heated to effect polymerization of monomers with high melting points, advantages of using photoinitators were noted. For example, if latency is desirable for processing, storage or handling, the material may be irradiated at room temperature or at processing temperatures that are below the cure temperature or the monomer melting point, allowing the material to remain uncured until some higher temperature is reached.

The examples were prepared according to General Preparation Procedure 1, using the components and amounts summarized in Table 5. The examples were evaluated by PDSC to determine if polymerization took place. Results are presented in Table 5. Example 24 demonstrated latent thermal curing, activated by ambient temperature irradiation, which is desirable in certain processing applications.

TABLE 5

| Examples | Initiator (0.02 g) | BOX (g) | Phenolic Resin (wt) | PDSC (J/g) |
|---|---|---|---|---|
| 19 | $CpFeXylPF_6$ | 1.00 | — | 57 |
| 20 | $CpFeXylPF_6$ | 0.487 | Bisphenol A (0.514 g) | 62 |
| 21 | $CpFeXylPF_6$ | 0.67 | SD 7280 (0.33 g) | 64 |
| 22 | $CpFeMesPF_6$ | 0.67 | SD 7280 (0.33 g) | 29 |
| 23 | $CpFeXylCF_3SO_3$ | 0.67 | SD 7280 | 37 |
| 24(d) | $CpFeXylPF_6$ | 0.67 | SD 7280 (0.33 g) | — |

(d)Mixture irradiated for 2 minutes at ambient temperature and subsequently heated to 350° C. at a rate of 10° C./min. A polymerization exothermic peak at 219° C. with a total energy of 185 J/g was observed.

Comparative Examples C7–C8

Examples were prepared to ascertain whether a polymeric composition containing a multifunctional oxazoline would crosslink without a catalyst (Example C7) and to ascertain whether a monofunctional oxazoline would polymerize in the absence of a catalyst (Example C8).

Comparative Example C7

Poly-IPO (Example 1a) was dissolved in γ-butyrolactone and heated to 200° C. for 30 min. in the absence of a catalyst. No crosslinking or gel formation was noted. DSC analysis did not show a polymerization exotherm.

Comparative Example C9

2-Phenyl-2-oxazoline heated to 200° C. for 5 min. in the absence of a catalyst did not polymerize, as no increase in viscosity was observed. DSC did not show a polymerization exotherm.

Example 25a

The organometallic compounds are also useful for thermal and photochemical curing of oxazoline multifunctional compounds, as well as monofunctional compounds. In Examples 25a, 26 and 27, UV irradiation was carried out using Phillips T-8 TLD 15W 103 bulbs. 2-Phenyl-2-oxazoline polymerizes in 10 min after irradiation with UV light at 140° C. with 2% (by weight) $CpFeMesPF_6$. 2-Phenyl-2-oxazoline does not polymerize after 10 min at 140° C. with 2% (by weight) $CpFeMesPF_6$ in the absence of UV irradiation, as evidenced by a lack of change in viscosity. This example shows that irradiation using the organometallic compounds of the invention as photocatalyst can lower the cure temperature of oxazoline compositions to 140° C.

Example 25

Four identical samples of poly-IPO (Example 1a) were dissolved in γ-butyrolactone and were heated in open sample pans at 140°, 160°, 180° and 200° C., respectively, each in the presence of 2% (by weight) $Cp_2FeSbF_6$ for 5 minutes. The resulting material in all four samples was insoluble in ethyl alcohol, indicating that crosslinking had occurred at all temperatures.

Example 26

Poly-IPO was dissolved in γ-butyrolactone and heated in an open sample container to 140° C. for 5 minutes in the presence of 2% (by weight) $CpFeMesPF_6$ under UV lights. The resulting material was insoluble in ethanol, indicating that crosslinking had occurred.

Example 27

A sample of 2-phenyl-2-oxazoline was mixed with 2% by weight of $Cp_2FePF_6$ and heated to 180° C. for 5 minutes.

The resulting solid polymer was soluble in dimethylacetamide (DMA) and in dimethyl sulfoxide (DMSO), and was characterized by $^1$H NMR and IR. DSC showed an exotherm at 171° C. for the polymerization with an energy of 26 J/g.

Examples 28–32

A series of examples was prepared, combining BOX and a phenolic resin with a thermoplastic resin. Such combinations can be applied to a substrate or carrier web or liner by solvent coating, hot melt extrusion or spin coating. In the examples, the cured coatings demonstrated excellent adhesion to a wide variety of substrates, indicating that they are excellent adhesives and protective coatings. In particular, the adhesives demonstrate good adhesion to polyimide film and constructions derived using polyimide film.

A. Electronics Adhesives—Peel Tests

Samples for 90° peel adhesion tests were prepared using prepared adhesive films of the present invention to bond flex circuitry to glass plates that were coated with indium-tin oxide (ITO). The adhesive films were pretacked to the flex circuits by application of heat (110° C.) and gentle pressure (rubbing by hand with a cotton-tipped wooden applicator) for 2–5 seconds. The bonds were made at 2 MPa for 20 seconds using a Phasemaster-4 hot-bar coater (available from Unitek, Monrovia, Calif.) with the thermode set to 300° C. These bonding conditions heated the adhesive in the bond line to 180° C. A solid blade-type thermode of 1.5 mm width was used. 90° peel strengths were measured by an Instron model 1122, using a standard moving crosshead load frame with a 2.54 mm/min peel rate.

1. Peel test #1

The above method was used with flex circuitry consisting of gold metallized over 35 micrometer thick copper traces on polyimide film (from Minco Products, Inc., Fridley, Minn.).

2. Peel test #2

The above method was used with flex circuitry consisting of gold metallized over 35 micrometer thick copper traces on Kapton E polyimide film (DuPont).

Example 28

Three parts PVB, 2 parts BOX and 1 part SD 7280 were combined and dissolved in 8 parts methyl ethyl ketone to prepare a coatable mixture. Prior to coating, 2% by weight $Cp_2FePF_6$ (based on the weight of BOX plus SD 7280) dissolved in a few drops of γ-butyrolactone was added. Coatings of 0.025 mm dry thickness were solvent coated onto 0.075 mm polypropylene release liner and dried at room temperature for 24 hours.

When evaluated using peel test #1, average maximum peel values of 197 g/cm were obtained (average of 3 tests).

Example 29

Three parts PKHC, 2 parts BOX and 1 part SD 7280 were combined and dissolved in 8 parts tetrahydrofuran to prepare a coatable mixture. Prior to coating, 2% by weight $Cp_2FePF_6$ (based on the weight of BOX plus SD 7280) dissolved in a few drops of γ-butyrolactone was added. Coatings of 0.025 mm dry thickness were solvent coated onto 0.075 mm polypropylene release liner and dried at room temperature for 24 hours.

When evaluated using peel test #1, average maximum peel values of 480 g/cm were obtained (average of three tests).

Example 30

Three parts Unirez 2636, 2 parts BOX and 1 part SD 7280 were combined and dissolved in 8 parts of tetrahydrofuran to prepare a coatable mixture. Prior to coating, 2% by weight $Cp_2FePF_6$ (based on the weight of BOX plus SD 7280) dissolved in a few drops of γ-butyrolactone was added. Coating films of 0.0125, 0.025 and 0.050 mm thickness were solvent coated onto 0.075 mm polypropylene release liner and dried at room temperature for 24 hours.

When evaluated using peel test #2, peel values of 1427 g/cm were obtained (average of three tests), with average peel values of 1260 g/cm after aging 500 hours at 60° C. and 95% RH (average of three tests) for coatings of 0.025 mm thickness. When evaluated using peel test #1, peel values of 1050 g/cm before aging (average of three tests) and 925 g/cm after aging (average of three tests) were obtained under conditions described above for coatings of 0.025 mm thickness.

Example 30a

Multiple layers of the 0.025 mm thick adhesive film described in Example 30 were placed atop one another in a silicone rubber mold measuring 50×5×1.6 mm, and the layered material was heated in the mold for 2 hours at 170° C. followed by 1 hour at 190° C. in an air-circulating oven. TGA of the molded sample in air showed 10% weight loss occurring at 370° C.

Dog bone specimens were prepared from 0.175 mm thick films of the resin mixture described in Example 30 which had been coated on silicone rubber and cured for 2 hours at 170° C. followed by 1 hour at 190° C. in an air-circulating oven. The stamped-out cured dog bone specimens were 0.125 mm thick. On testing in an Instron Model 1122 tensile tester, the material showed a modulus of 13.6 MPa, ultimate tensile strength of 9.8 MPa, 401% elongation to break, and 0.15N·m energy at break.

B. Vibration Damping Materials

As is known in the art, the most efficient use of a vibration damping material occurs if the material is sandwiched between a panel to be damped and a relatively stiff layer. This forces the damping material into shear mode as the panel vibrates, dissipating substantially more energy than when the damping material acts simply in extension and compression. A suitable material for a substrate has a stiffness of at least 0.40 (relative to stainless steel) as defined in *Handbook of Tables for Applied Science*, Boltz, R. E. et al., eds., CRC Press: Cleveland, Ohio., 1974, p. 130.

The adhesive preparation of Example 30, coated as a 0.025 mm thick coating on polypropylene release liner was dried as described, then transferred onto a steel plate (51× 9.5×0.23 mm). A second steel plate of identical dimensions was placed on top of the test piece and in contact with the adhesive to make a sandwich construction which was clamped together with two paper clips. The construction was heated at 180° C. for 20 minutes in an air-circulating oven to cure the adhesive. The resulting cured sandwich construction, called a constrained layer sample, was analyzed by dynamic mechanical analysis in the flexure mode from −30° C. to +350° C. on a Seiko II DMA instrument at 1 Hz. The temperature range over which the tan δ was greater than 0.6 was 9.3° C. to 323.6° C., a range of 314.3° C., demonstrating vibration damping capabilities over a very broad temperature range.

A second constrained layer sample, prepared as described above (sample thickness, plate size, cure temperature and time) was tested in the Seiko II DMA instrument at 1 Hz by ramping the temperature from −70° C. to +260° C., holding the temperature at 260° C., then rapidly cooling with cold nitrogen gas, through four cycles. In the fourth cycle, the temperature range over which the tan δ was greater than 0.6 was 8.3° C. to 120° C., a range of 111.7° C., demonstrating the thermal stability of the BOX/Unirez 2636/SD 7280 adhesive.

C. Laser Definable Coatings and Adhesives

The adhesive formulation of Example 30 was spin-coated at 1000–1500 rpm to a thickness of approximately 5 micrometers (μm) on 0.051 mm Kapton-E™ polyimide film. Laser milling was carried out on a 5 μm thickness of adhesive spun-coated as above, at 360, 450 or 500 mJ on an excimer laser at 248 nm, with fluences of 330, 420 or 460 mJ/cm$^2$, respectively, with a repetition rate of 1–3 Hz to obtain features in the range of 5 to 500 μm. The resultant sample could be cured for 15 minutes in an air-circulating oven, the ablated patterned coating becoming a protective coating. Alternatively, the resultant sample was bonded to, for example ITO coated glass, to provide an adhesive with defined features.

Example 31

Photodefinable Coatings

The adhesive formulation of Example 30 was spin-coated at 1500 rpm onto a silicon wafer of 102 mm diameter and 0.5 mm thickness which had been cleaned by washing with deionized water. The coated wafer was placed in a closed, air-circulating oven at 60° C. for 15 minutes to remove residual solvent. The dried coating was 6 μm thick. The dried wafer was photo-imaged in a JBA mask aligned exposure unit (Jerry Bachur Associates, San Jose, Calif.) as described below. The JBA exposure unit was equipped with a collimated 500 watt mercury arc ultraviolet light source. The coating was exposed for 30 seconds at a light intensity of 14 milliwatts/cm$^2$ (300 mJ/cm$^2$) at a wavelength of 365 nm. The resolution mask was 152×152 mm chrome-on-glass. The photolithography pattern was a series of lines, which were 121 mm long and 2.5 mm to 4 μm wide. The imaged wafer was placed in an oven at 160° C. for 20 minutes to fix the image. Unexposed regions of the wafer were developed by washing with tetrahydrofuran, and the image was fully set by baking the wafer at 180° C. for 15 minutes or by subsequent bonding to another substrate as described for peel test #1, above. Microscopic examination of the wafer revealed image resolution of 30 μm. The imaged coating showed good adhesion to the silicon wafer.

Example 32

The thermoset adhesive as prepared in Example 4, above is useful in the construction of fiber optic connections, such as described in U.S. Pat. No. 5,101,463, FIG. 4. To prevent any relative movement between the elements, which would cause variations in the alignment of the optical fibers and loss of optical signal quality, it is useful to adhesively bond the elements together.

An adhesive of the present invention is melt formed at 140° C. into a cylindrical shape of the dimensions required by the ferrule—ferrule holder assembly (referring to FIG. 4 of U.S. Pat. No. 5,101,463). The cylindrically shaped adhesive is placed over the free end of the ferrule and positioned at the ferrule—ferrule holder juncture.

The assembly is placed into an oven and heated at 200° C. for 5 to 20 minutes. The adhesive cylinder melts and, by capillary action, flows into voids located between the walls of the mated components. Thereafter, the adhesive cures and adhesively bonds the ferrule and ferrule holder with the remaining adhesive material forming an end seal at the juncture of the two components.

Alternatively, other methods of application of the adhesive of the present invention to the fiber optic connector assembly may be used, such as but not limited to mechanical placement of pre-melted adhesive material, or placement of a powdered form of the adhesive to a preheated assembly.

Example 33

A fine powder mixture of 2 parts 1,3-phenylene bisoxazoline and 1 part SD 7280 was prepared, as described in Example 4. To this was added 2 wt % Cp$_2$FePF$_6$ as a catalyst. This formulation was thoroughly mixed as a fine powder dispersion.

Several fiber/connector assemblies were prepared as follows:

10–15 mg of the powdered adhesive formulation were inserted into the collar of an ST style fiber optic connector (available from 3M, 78-8073-7400-0). The connector was placed in a standard connector oven (available from 3M, 78-8073-7401-8). Upon heating for 40 to 50 seconds, the powder had liquefied and a prepared optical fiber (that is, stripped and cleaned) end was inserted into the connector. The connector remained in the oven until the total elapsed heating time was 3 minutes. The connector was then removed from the oven and allowed to cool to ambient temperature. Excess fiber, protruding from the ferrule, was scored and removed.

A. Tensile Testing

A series of connector/fiber assemblies were subjected to tensile testing to determine the load at which the optical fiber would separate from the connector. This pull-out testing gave an average (average of 10 tests per connector) load value of 4.3±0.5 pounds.

B. Optical Testing

Optical fiber jumpers were prepared using 62.5/125 μm multi-mode optical fiber and connectors containing the adhesive formulation described above. The jumpers were subjected to temperature cycle testing using a standard temperature profile (Bellcore prescribed, described below) from −40° C. to 80° C. The deviation in power did not exceed 0.06 decibels (dB), where the acceptable limit is 0.3 dB. The temperature cycle was extended to −40° C. to 100° C. with similar results (0.08 dB deviation). Jumpers were assembled using single mode fibers and a temperature cycle of −40° C. to 80° C. with a power deviation of 0.17 dB. This was considered a good performance.

1. Bellcore Test

The Bellcore test was performed on 5 assemblies of 2 connectors and a coupling. The following cycle was conducted on the assemblies for as many cycles that could be accomplished in a period of 48 hours.

| Dwell time and temperature | Ramp rate to end temperature |
| --- | --- |
| 1 hr @ 23° C. | 1°/min to 80° C. |
| 1 hr @ 80° C. | 1°/min to 23° C. |
| 1 hr @ 23° C. | 1°/min to −40° C. |
| 1 hr @ −40° C. repeat cycle | 1°/min to 23° C. |

Example 34

The morphology of the oxazoline-phenolic resin systems and, therefore, physical properties such as glass transition temperature, is controlled by the relative amount of BOX homopolymerization and BOX-phenolic resin copolymerization which occurs during the reaction. Because it is difficult to characterize these thermoset resins, a model compound study was carried out, using the reaction of t-butyl phenol with 2-phenyl-2-oxazoline. The model reaction demonstrates how control over homo- vs copolymerization controls polymer microstructure, connectivity of the network, and subsequently the extent of crosslinking. Therefore, the microstructure determines the morphology and the material properties of the resulting polymer system.

Reaction of t-butyl phenol and 2-phenyl-2-oxazoline

In order to determine the relative selectivity of catalysts of the invention for 2-phenyl-2-oxazoline homopolymerization [A] vs addition product [B] of 2-phenyl-2-oxazoline with t-butyl phenol, a series of reactions was carried out using the catalysts shown in Table 7, under conditions as described below, replacing pTSA with the catalyst to be tested, as follows: To 0.46 grams 2-phenyl-2-oxazoline and 0.23 grams t-butyl phenol was added 0.02 grams catalyst from Table 7. The reaction was carried out in a side-armed test tube which was open to the air and was maintained at 170° C. for 16 hours. The 2:1 ratio of oxazoline:phenol was chosen to represent bisoxazoline-phenolic resin systems.

Preparation of poly(2-phenyl-2-oxazoline) [A]

A pure sample of poly(2-phenyl-2-oxazoline) was obtained for comparative purposes as follows:

A mixture of 191.53 grams 2-phenyl-2-oxazoline (Aldrich Chemicals) and 52 ml anhydrous N, N'-dimethylacetamide was treated with a solution of 1.28 grams methyl-p-toluenesulfonate in 20 ml anhydrous N,N'-dimethylacetamide and stirred under nitrogen at 80° C. for 24 hours. The solvent was removed under reduced pressure and the product was precipitated from water in a blender, collected on a filter and dried overnight in a vacuum oven at 60° C. Structure of the product was confirmed by proton NMR.

Preparation of Addition Product of t-Butylphenol/2-Phenyl-2-oxazoline [B]

A pure sample of the addition product of t-butylphenol and 2-phenyl-2-oxazoline was obtained for comparative purposes as follows: in a side-armed test tube, 2.94 grams 2-phenyl-2-oxazoline and 3.00 grams t-butyl phenol were combined with 0.08 gram pTSA. The stirred mixture was heated under nitrogen at 170° C. for 16 hours. Pure amide ether addition product [B] was obtained from the reaction mixture by column chromatography on silica gel. The crude reaction mixture was taken up in tetrahydrofuran and introduced onto the column, which was subsequently eluted with 1/1 (v/v) hexane/ethyl acetate. Desired fractions were identified by thin layer chromatography, and the product structure was confirmed by $^1H$ and $^{13}C$ NMR. The reaction is outlined in Scheme 1.

Scheme 1: Oxazoline Homopolymerization and Addition Product Formation in 2-Phenyl-2-Oxazoline/t-Butyl Phenol Reaction

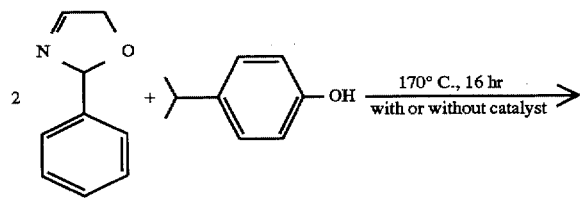

-continued
Scheme 1: Oxazoline Homopolymerization and Addition Product Formation in 2-Phenyl-2-Oxazoline/t-Butyl Phenol Reaction

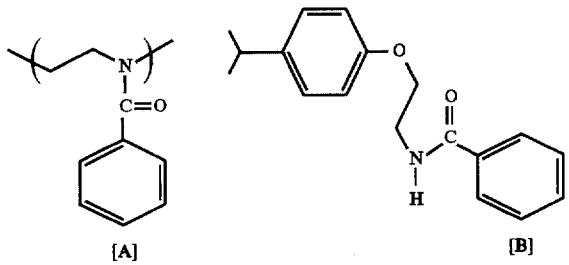

Gel permeation chromatography (GPC) was used to characterize the reaction products. Areas under the curve of the GPC trace for each reaction product were measured and their relative ratios were determined. GPC retention times for each starting material and reaction product are shown in Table 6. Percent conversion of phenyloxazoline is determined by the amount of 2-phenyl-2-oxazoline consumed in the reactions based on GPC data. A catalyst was considered preferential for homopolymerization if the ratio of polymer to adduct ([A]:[B], in Scheme 1) was greater than 4 and considered preferential for copolymerization if the ratio was less than 0.25. Catalysts with intermediate ratios were considered to be preferential for both homo- and co-polymerization. Table 7 shows the result of the catalyst preference tests.

TABLE 6

| Reactant/Product | GPC Retention Time (minutes) |
|---|---|
| t-butyl phenol | 39.5 |
| 2-phenyl-2-oxazoline | 45.6 |
| poly(2-phenyl-2-oxazoline) [A] | <32 |
| addition product [B] | 37.5 |

TABLE 7

Catalyst Preference for Homopolymerization, Copolymerization, or Both

| Catalyst | Polymer/Adduct | % Conversion of Phenyloxazoline |
|---|---|---|
| Cp₂FePF₆ | 52.6/2.3 | 100 |
| (Dur)₂Fe(SbF₆)₂ | 43.1/3.2 | 100 |
| Cp₂FeSbF₆ | 33.7/10.7 | 100 |
| CpFe(xyl)PF₆ | 14.4/12.4 | 93 |
| No catalyst | 1.2/17.2 | 66 |
| CpFe(xyl)SbF₆ | nil/21.1 | 93 |
| Cp₂TiCl₂ | nil/21.0 | 92 |
| CpFe(CO₂)₂I | nil/33.6 | 88 |
| CpFe(CO₂)₂Br | nil/36.9 | 84 |
| [CpFe(CO₂)₂]₂ | nil/34.2 | 83 |

Summary

Catalyst preference can be used to obtain a thermosetting resin with specific properties. For example, to those skilled in the art, it is known that in crosslinking systems, of which bisoxazoline homopolymerization is representative, the gel point is reached at very low percent conversion. A catalyst that promotes oxazoline homopolymerization is preferred in certain thin film applications and in systems where rapid processing is desirable. Other applications, particularly those in which the thermosetting resin system is used in greater thicknesses, require a slower cure with less heat evolution, therefore a catalyst that promotes copolymerization of oxazoline and phenolic resin is preferred. The category of homo- and copolymerization catalysts provides intermediate gel times as well as the option of photopolymerization. The catalysts systems used in this invention comprise all three categories to offer novel tailorable resin systems.

Thus, the selection of catalyst can produce, for instance, higher Tg thermosetting resins comprised principally of crosslinked oxazoline, lower Tg thermosetting resins comprised principally of an oxazoline-phenolic resin copolymer, as well as thermosetting resins of intermediate Tg.

Various modifications and alterations of this invention will become apparent to those skilled in the art without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

What is claimed:

1. An energy polymerizable composition comprising:
 a) at least one cationically curable 1,3-oxazyl heterocyclic monomer or compound; and
 b) a catalytically effective amount of an initiator comprising an organometallic compound.

2. The energy polymerizable composition according to claim 1 wherein the 1,3-oxazyl heterocyclic monomer or compound has a nucleus with the structure:

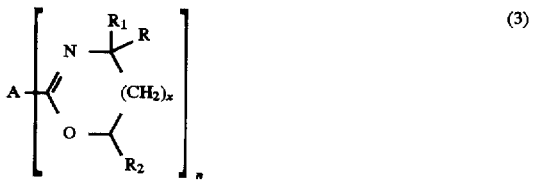

(3)

wherein

A is selected from the group consisting of a cyclic or acyclic aliphatic or substituted cyclic or acyclic aliphatic moiety having from 1 to 20 carbon atoms or an aromatic (aryl) mono- or multinuclear or aliphatic substituted aryl residue having from 6 to 20 carbon atoms and a polymeric or oligomeric residue comprising from about 2 to 200,000 repeating units;

R independently represents H, $CH_3$, $CH_2$—$CH_3$, or $C_6H_5$;

$R_1$ and $R_2$ independently represent H or $CH_3$, provided R and $R_2$ are not both $CH_3$;

x represents an integer of 0 or 1;

n represents an integer of 1, 2, 3 or 4.

3. The energy polymerizable composition according to claim 1 wherein the 1,3-oxazyl heterocyclic monomer or compound has a nucleus with the structure:

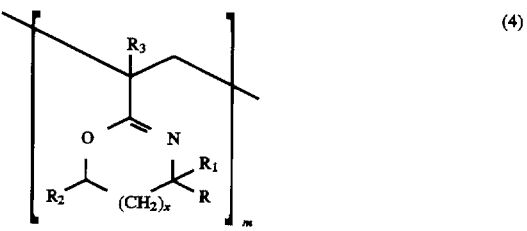

(4)

wherein

R, $R_1$ and $R_2$ and x are as described above;

$R_3$ represents H or $CH_3$; and m is an integer in the range of 2 to 500,000.

4. The energy polymerizable composition according to claims 1, 2 or 3 wherein the initiator has the following formula:

$$[(L\ 1)_a(L2)_bM]^{+q}[X_n]$$

wherein

M is selected from the group containing Cr, Ni, Mo, W, Mn, Tc, Re, Fe, Ru, Os, Co, Rh and Ir;

L1 represents a ligand contributing pi-electrons that can be selected from substituted and unsubstituted aromatic compounds and substituted and unsubstituted heterocyclic aromatic compounds, and capable of contributing six pi-electrons to the valence shell of M;

L2 represents a ligand contributing pi-electrons that can be selected from substituted and unsubstituted cyclopentadienyl and indenyl anions, and capable of contributing six pi-electrons to the valence shell of M;

a is 0, 1 or 2; and b is 0, 1 or 2, with the proviso the sum of [a+b] is 2;

q is 1 or 2, the residual charge of the complex cation;

X is an anion selected from organic sulfonate anions and halogen-containing complex anions of a metal or metalloid; and n is 1 or 2, the number of complex anions required to neutralize the charge q on the complex cation.

5. The energy polymerizable composition according to claim 4 wherein X has the following formula:

$$DQ_r$$

wherein

D is a metal from Groups IB to VIIB and VIII or a metal or metalloid from Groups IIIA to VA of the Periodic Chart of Elements (CAS notation), Q is a halogen atom, hydroxyl, a phenyl group or an alkyl group, and r is 1 to 6.

6. The energy polymerizable composition according to claim 4 wherein L1 is a substituted or unsubstituted aromatic compound based on benzene and L2 is a substituted or unsubstituted compound containing a cyclopentadienyl anion, M is Fe and X is selected from the group consisting of tetrafluoroborate, hexafluorophosphate, hexafluoroarsenate, hexafluoroantimonate, hydroxylpentafluoroantimonate and trifluoroethanesulfonate.

7. The energy polymerizable composition according to claim 4 wherein b is equal to 2, M is Fe and X is selected from the group consisting of tetrafluoroborate, hexafluorophosphate, hexafluoroarsenate, hexafluoroantimonate, hydroxylpentafluoroantimonate and trifluoroethanesulfonate.

8. The energy polymerizable composition according to claim 1 wherein the 1,3-oxazyl heterocyclic monomer or compound is essentially free of other functional groups that would react either the oxazyl heterocyclic ring or an aromatic hydroxyl group.

9. The energy polymerizable composition according to claims 1, 2 or 3 further comprises a phenolic compound that contains two or more phenolic hydroxyl groups per molecule.

10. The energy polymerizable composition according to claims 1, 2, or 3 further comprises a thermoplastic resin.

11. The energy polymerizable composition according to claim 10 wherein the thermoplastic resin is a polyamide, poly(vinyl)butyral, or polyether resin.

12. A polymerized composition comprising the polymerization product of the polymerizable mixture according to claim 1.

* * * * *